US010965307B2

(12) United States Patent
Tamori

(10) Patent No.: US 10,965,307 B2
(45) Date of Patent: Mar. 30, 2021

(54) SIGNAL PROCESSING APPARATUS, SIGNAL PROCESSING METHOD, AND PROGRAM

(71) Applicant: SONY CORPORATION, Tokyo (JP)

(72) Inventor: Yoshinori Tamori, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/767,486

(22) PCT Filed: Nov. 21, 2018

(86) PCT No.: PCT/JP2018/042923
§ 371 (c)(1),
(2) Date: May 27, 2020

(87) PCT Pub. No.: WO2019/111703
PCT Pub. Date: Jun. 13, 2019

(65) Prior Publication Data
US 2020/0382130 A1  Dec. 3, 2020

(30) Foreign Application Priority Data

Dec. 5, 2017  (JP) .............................. JP2017-233096

(51) Int. Cl.
H03M 1/12 (2006.01)
H03M 1/50 (2006.01)
H03M 1/60 (2006.01)
H04R 3/00 (2006.01)
H03L 7/093 (2006.01)
H03M 1/82 (2006.01)
(Continued)

(52) U.S. Cl.
CPC ............ H03M 1/504 (2013.01); H03L 7/093 (2013.01); H03M 1/60 (2013.01); H03M 1/822 (2013.01);
(Continued)

(58) Field of Classification Search
CPC . H03M 1/12; H03M 5/08; H03M 3/30; G11B 20/1411
(Continued)

(56) References Cited

U.S. PATENT DOCUMENTS 6,304,200 B1 10/2001 Masuda
2005/0180499 A1* 8/2005 Hsu ..................... H03K 7/08
375/238
(Continued)

FOREIGN PATENT DOCUMENTS

CN    1247414 A    3/2000
CN    1713529 A    12/2005
(Continued)

OTHER PUBLICATIONS

International Search Report and Written Opinion of PCT Application No. PCT/JP2018/042923, dated Feb. 19, 2019, 09 pages of ISRWO.

Primary Examiner — Joseph J Lauture
(74) Attorney, Agent, or Firm — Chip Law Group

(57) ABSTRACT

The present technology relates to a signal processing apparatus, a signal processing method, and a program that allow an improvement in the rate of modulation of PWM signals. Pulse width modulation (PWM) is performed to convert one of a 0 or 1 represented by a bit of a pulse density modulation (PDM) signal into which an audio signal has been PDM-modulated, into a maximum-length pulse of a maximum pulse width of a PWM signal having a period equal to the period of the PDM signal, and convert the other of the 0 or 1 of the PDM signal into a minimum-length pulse of a minimum pulse width of the PWM signal at a position adjacent to the center of the period of the PWM signal. The present technology is applicable, for example, to audio reproduction systems that reproduce audio signals.

7 Claims, 10 Drawing Sheets

(51) Int. Cl.
*H03M 5/08* (2006.01)
*G11B 20/14* (2006.01)
*H03M 3/00* (2006.01)

(52) U.S. Cl.
CPC ............ *H04R 3/00* (2013.01); *G11B 20/1411* (2013.01); *H03M 1/12* (2013.01); *H03M 3/30* (2013.01); *H03M 5/08* (2013.01)

(58) Field of Classification Search
USPC .................... 341/155, 126, 53, 143; 375/238
See application file for complete search history.

(56) References Cited

U.S. PATENT DOCUMENTS

| | | |
|---|---|---|
| 2005/0285765 A1 | 12/2005 | Suzuki et al. |
| 2008/0024341 A1 | 1/2008 | Inukai et al. |
| 2010/0289546 A1 | 11/2010 | Dooper et al. |

FOREIGN PATENT DOCUMENTS

| | | |
|---|---|---|
| CN | 101416397 A | 4/2009 |
| DE | 102005029490 A1 | 1/2006 |
| DE | 69927896 T2 | 7/2006 |
| EP | 0982865 A2 | 3/2000 |
| EP | 2005593 B1 | 2/2010 |
| JP | 2000-68835 A | 3/2000 |
| JP | 2000-068841 A | 3/2000 |
| JP | 2003-229768 A | 8/2003 |
| JP | 2006-42315 A | 2/2006 |
| JP | 2008-35027 A | 2/2008 |
| JP | 2009-005302 A | 1/2009 |
| JP | 2009-531932 A | 9/2009 |
| JP | 2016-19274 A | 2/2016 |
| KR | 2000-0017464 A | 3/2000 |
| KR | 10-2006-0049666 A | 5/2006 |
| WO | 2007/113736 A1 | 10/2007 |

* cited by examiner

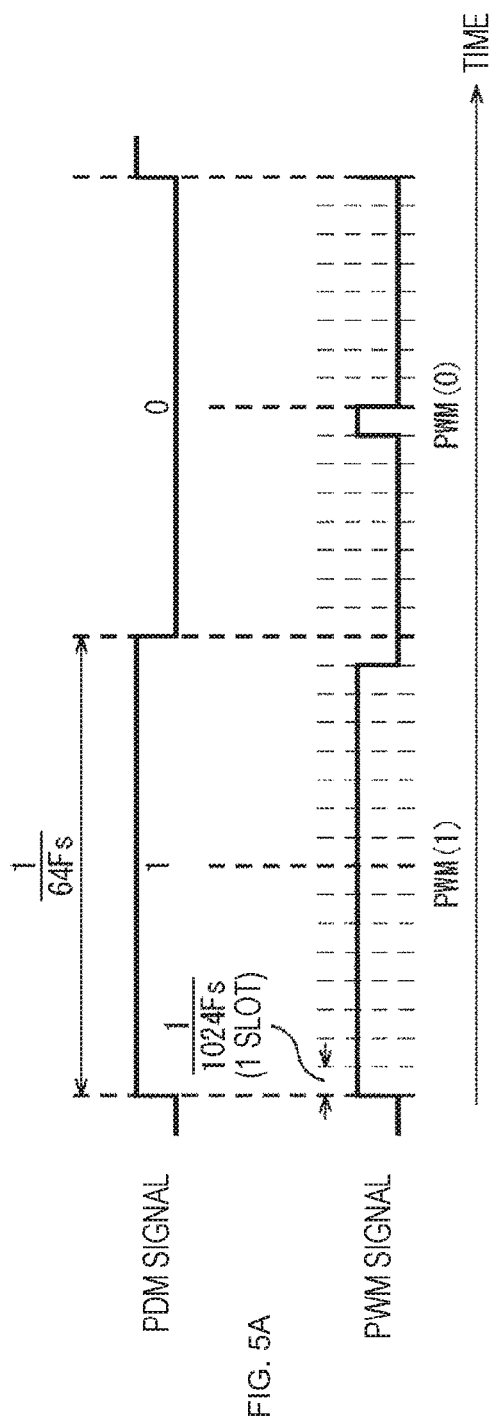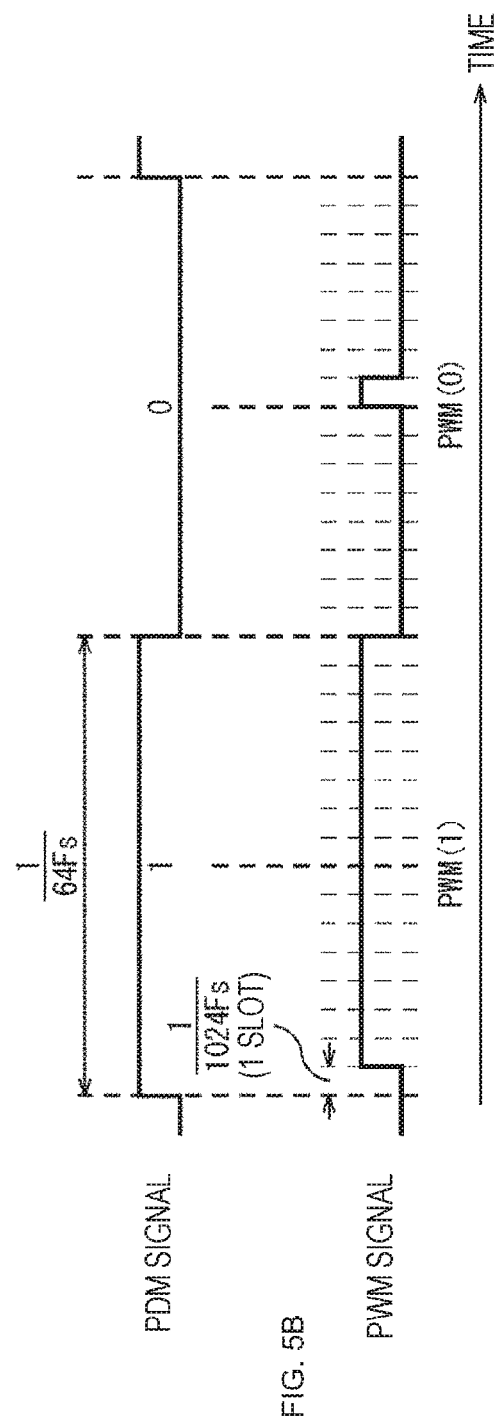

SIGNAL PROCESSING APPARATUS, SIGNAL PROCESSING METHOD, AND PROGRAM

CROSS REFERENCE TO RELATED APPLICATIONS

This application is a U.S. National Phase of International Patent Application No. PCT/JP2018/042923 filed on Nov. 21, 2018, which claims priority benefit of Japanese Patent Application No. JP 2017-233096 filed in the Japan Patent Office on Dec. 5, 2017. Each of the above-referenced applications is hereby incorporated herein by reference in its entirety.

TECHNICAL FIELD

The present technology relates to a signal processing apparatus, a signal processing method, and a program, and more particularly, relates to a signal processing apparatus, a signal processing method, and a program that allow an improvement in the rate of modulation of a pulse width modulation (PWM) signal obtained by PWM-modulating an audio signal of a pulse density modulation (PDM) signal.

BACKGROUND ART

Drive systems for driving (amplifiers that provide audio signals to) speakers include balance transformer less (BTL) drive and single end (SE) drive. For example, Patent Document 1 describes PWM modulation used in BTL drive.

CITATION LIST

Patent Document

Patent Document 1: Japanese Patent Application Laid-Open No. 2000-68835

SUMMARY OF THE INVENTION

Problems to be Solved by the Invention

In a case where an audio signal is reproduced by speakers, driving the speakers in BTL drive provides better performance than in SE drive in terms of sound quality such as noise reduction.

However, in some cases, SE drive has to be adopted rather than BTL drive due to limitations in cost, system size, and the like. In a case where speakers are driven in SE drive, the rate of modulation into a PWM signal is lower than in a case where the speakers are driven in BTL drive. As a result, the output of an amplifier and, eventually, the sound pressure of the speakers can decrease.

The present technology has been made in view of such circumferences, and is intended to allow an improvement in the rate of modulation of PWM signals.

Solutions to Problems

A signal processing apparatus or a program of the present technology is a signal processing apparatus that includes a pulse width modulation (PWM) converter that performs PWM modulation to convert one of a 0 or 1 represented by a bit of a pulse density modulation (PDM) signal into which an audio signal has been PDM-modulated, into a maximum-length pulse of a maximum pulse width of a PWM signal having a period equal to a period of the PDM signal, and convert the other of the 0 or 1 of the PDM signal into a minimum-length pulse of a minimum pulse width of the PWM signal at a position adjacent to a center of the period of the PWM signal, or a program that causes a computer to function as the signal processing apparatus.

A signal processing method of the present technology is a signal processing method that includes performing pulse width modulation (PWM) to convert one of a 0 or 1 represented by a bit of a pulse density modulation (PDM) signal into which an audio signal has been PDM-modulated, into a maximum-length pulse of a maximum pulse width of a PWM signal having a period equal to a period of the PDM signal, and convert the other of the 0 or 1 of the PDM signal into a minimum-length pulse of a minimum pulse width of the PWM signal at a position adjacent to a center of the period of the PWM signal.

In a signal processing apparatus, a signal processing method, and a program of the present technology, pulse width modulation (PWM) is performed to convert one of a 0 or 1 represented by a bit of a pulse density modulation (PDM) signal into which an audio signal has been PDM-modulated, into a maximum-length pulse of a maximum pulse width of a PWM signal having a period equal to a period of the PDM signal, and convert the other of the 0 or 1 of the PDM signal into a minimum-length pulse of a minimum pulse width of the PWM signal at a position adjacent to a center of the period of the PWM signal.

Effects of the Invention

According to the present technology, the rate of modulation of PWM signals can be improved.

Note that the effects described here are not necessarily limiting, and any effect described in the present disclosure may be included.

BRIEF DESCRIPTION OF DRAWINGS

FIGS. 5A and 5B are waveform diagrams illustrating second PWM modulation in SE drive.

MODE FOR CARRYING OUT THE INVENTION

<1. Configuration Example of Audio Reproduction System>

Figure 1:
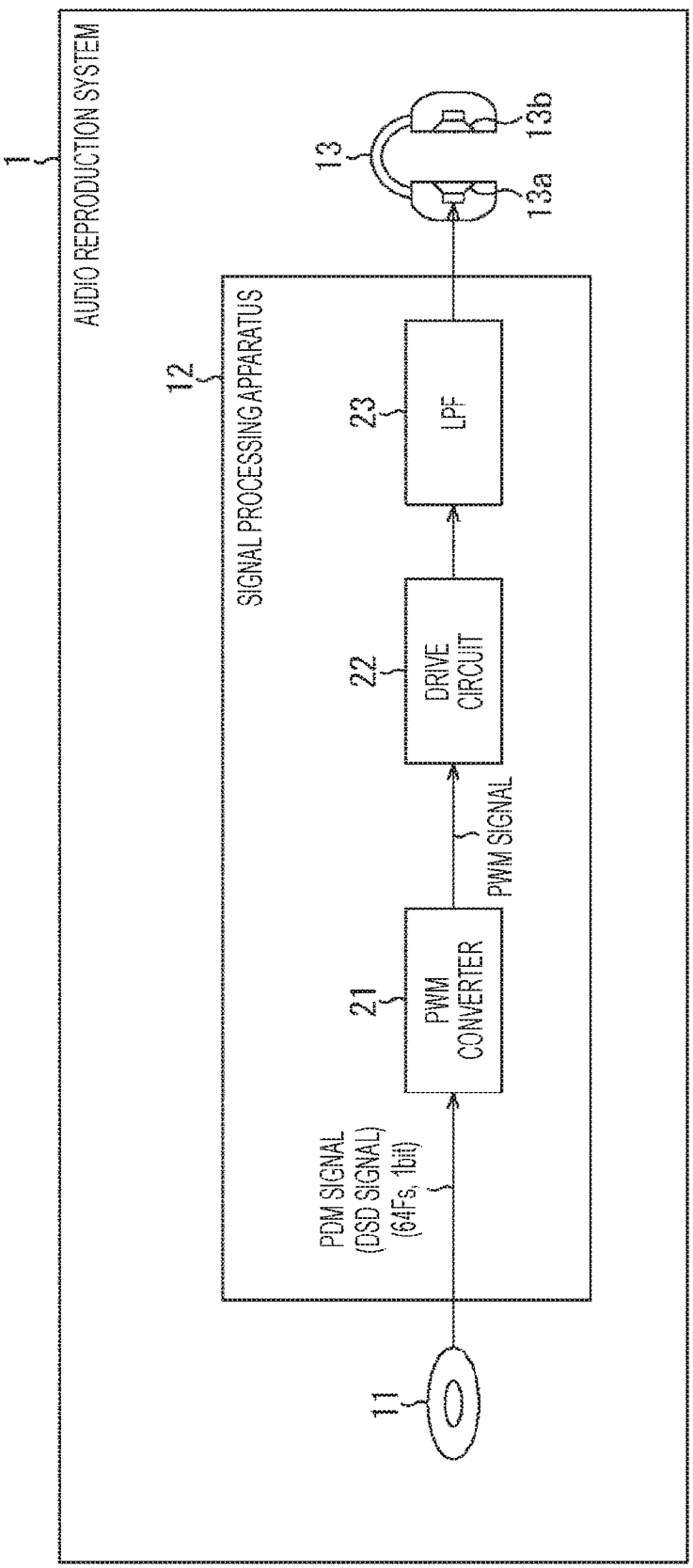
FIG. 1 is a block diagram illustrating a configuration example of an embodiment of an audio reproduction system to which the present technology is applied.

FIG. 1 is a block diagram illustrating a configuration example of an embodiment of an audio reproduction system to which the present technology is applied.

An audio reproduction system 1 illustrated in FIG. 1 includes a storage medium 11, a signal processing apparatus 12, and headphones 13, and reproduces an audio signal.

The storage medium 11 stores a PDM signal into which an audio signal has been PDM-modulated. The PDM signal stored in the storage medium 11 is read from the storage medium 11 and transmitted to the signal processing apparatus 12.

Here, the PDM signal stored in the storage medium 11 is a one-bit signal into which the audio signal has been PDM-modulated, for example, at a sampling frequency of a power of two times a sampling frequency Fs of 44.1 kHz under the Compact Disc Digital Audio (CD-DA) standard, for example, of 2.8224 MHz (=64 Fs) equivalent to 64 times.

PDM signals of audio signals include signals called direct stream digital (DSD), and the like.

The signal processing apparatus 12 includes a PWM converter 21, a drive circuit 22, and a low-pass filter (LPF) 23.

The PWM converter 21 receives the PDM signal from the storage medium 11. The PWM converter 21 performs PWM modulation on the PDM signal received from the storage medium 11, specifically, among first PWM modulation in SE drive, second PWM modulation in SE drive, and PWM modulation in BTL drive as described later, the second PWM modulation in SE drive in particular. The PWM converter 21 provides a PWM signal obtained by the PWM modulation to the drive circuit 22.

The drive circuit 22 has a digital amplifier built in as a preamplifier and a power amplifier (not illustrated), amplifies the PWM signal provided from the PWM converter 21, and provides the amplified PWM signal to the LPF 23.

The LPF 23 performs filtering on the PWM signal provided from the drive circuit 22, and provides an audio signal obtained by the filtering to the headphones 13.

The headphones 13 include a left (L) channel speaker 13a and a right (R) channel speaker 13b.

The headphones 13 output sound corresponding to the audio signal provided from the LPF 23 from the speaker 13a and the speaker 13b.

Figure 2:
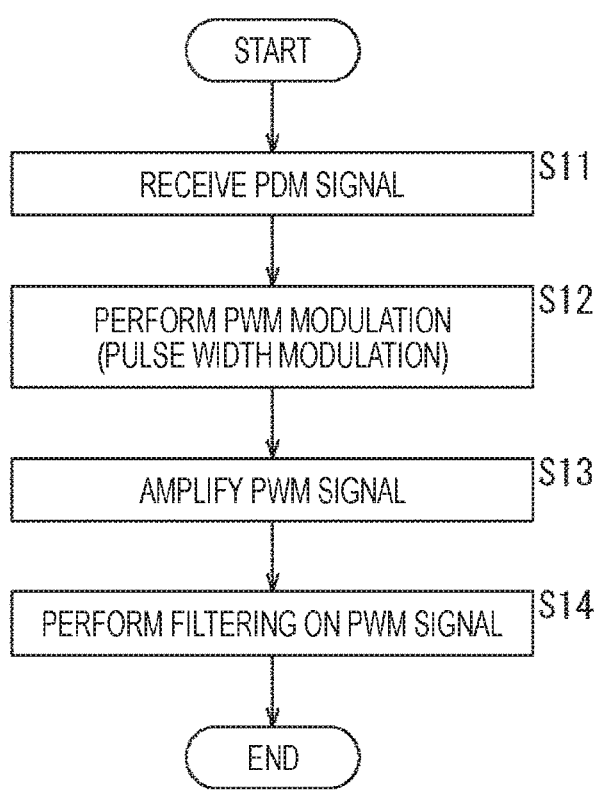
FIG. 2 is a flowchart illustrating signal processing in a signal processing apparatus.

FIG. 2 is a flowchart illustrating signal processing in the signal processing apparatus 12.

In step S11, the PWM converter 21 receives the PDM signal from the storage medium 11.

In step S12, the PWM converter 21 performs PWM modulation (pulse width modulation) on the PDM signal received from the storage medium 11, converting the PDM signal into a PWM signal. The PWM converter 21 provides the PWM signal to the drive circuit 22.

In step S13, the drive circuit 22 amplifies the PWM signal provided from the PWM converter 21. The drive circuit 22 provides the amplified PWM signal to the LPF 23.

In step S14, the LPF 23 performs filtering on the amplified PWM signal provided from the drive circuit 22. The LPF 23 provides an audio signal obtained by the filtering to the headphones 13.

<2. PWM Modulation>

Hereinafter, PWM modulation performed by the PWM converter 21 to convert (modulate) a PDM signal into a PWM signal will be described.

Figure 3:
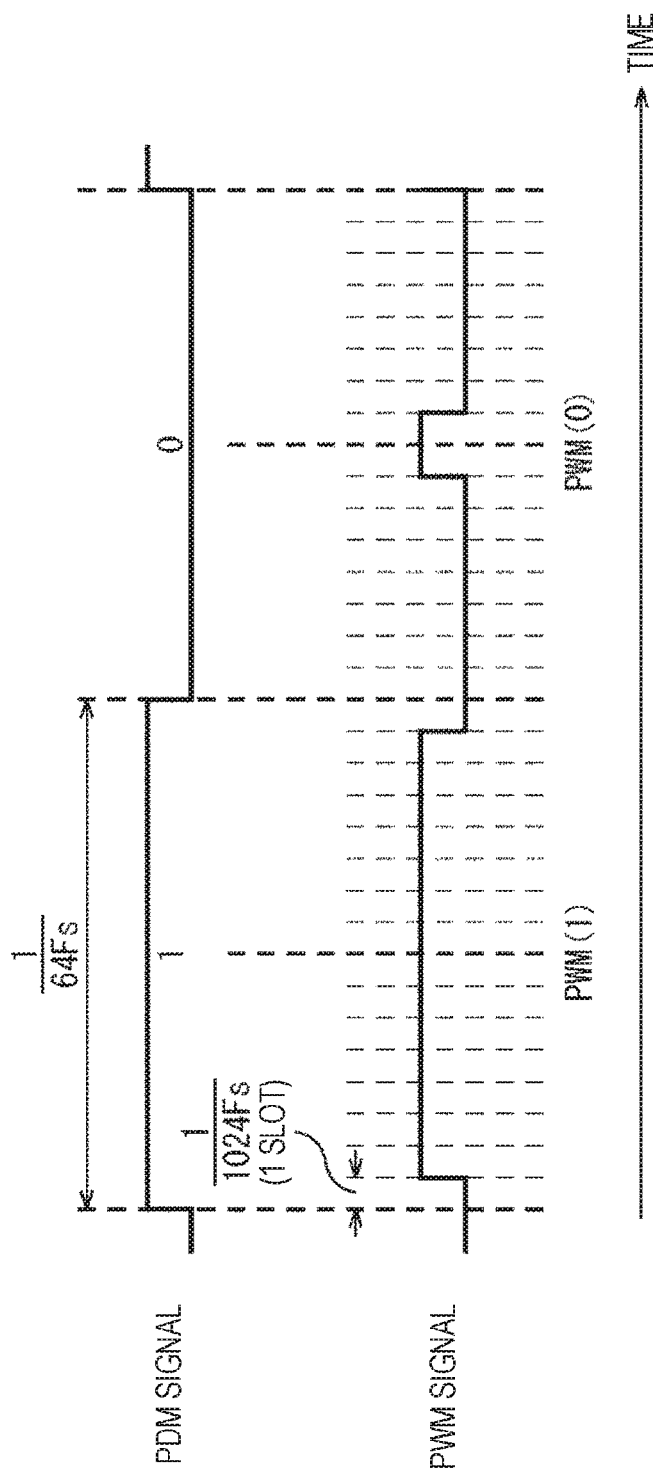
FIG. 3 is a waveform diagram illustrating first PWM modulation in SE drive.

FIG. 3 is a waveform diagram illustrating the first PWM modulation in SE drive.

In FIG. 3, the vertical axis represents signal level, and the horizontal axis represents time. The same applies to FIGS. 4, 5A, 5B, 6, 7, 8, and 9 described later.

Note that in the following, the period of a PDM signal is 1/(64 Fs), and the period of a PWM signal obtained by PWM modulation is also 1/(64 Fs) equal to the period of the PDM signal, unless otherwise specified.

Furthermore, PWM modulation of two samples (two periods) of the PDM signal in which a 0 and a 1 are continuous will be described.

Moreover, a PWM-modulated PWM signal corresponding to the 1 of the PDM signal is described as a PWM (1), and a PWM-modulated PWM signal corresponding to the 0 of the PDM signal is described as a PWM (0).

Furthermore, as the frequency of a master clock required for conversion into (generation of) a PWM signal by PWM modulation in the PWM converter 21, a frequency of a power of two times the sampling frequency Fs, for example, 1024 Fs of 1024 times is used.

The resolution of a PWM signal obtained by PWM modulation can be represented by the number of slots in one period of the PWM signal. The number of slots in one period can be determined by the frequency of the master clock/the (carrier) frequency of the PWM signal. In FIG. 3 (as in FIGS. 4, 5A, 5B, and 6 described later), it is sixteen slots (=1024 Fs/(64 Fs)). In the present embodiment, an even number is used as the number of slots in one period of a PWM signal.

Furthermore, in the PDM signal, a portion where one period (1/64 Fs) is at a high (H) level represents a 1, and a portion where one period (1/64 Fs) is at a low (L) level represents a 0.

In the first PWM modulation in SE drive, the 1 of the PDM signal is converted into a PWM (1) that is a pulse of a maximum pulse width line-symmetric with respect to the center of one period of the PWM signal. Furthermore, in the first PWM modulation in SE drive, the 0 of the PDM signal is converted into a PWM (0) that is a pulse of a minimum pulse width line-symmetric with respect to the center of one period of the PWM signal.

Thus, in FIG. 3, the first PWM modulation in SE drive converts the 1 of the PDM signal into the PWM (1) that is a pulse of a pulse width of seven slots to both the left and right from the center of one period of the PWM signal. Furthermore, the first PWM modulation in SE drive converts the 0 of the PDM signal into the PWM (0) that is a pulse of a pulse width of one slot to both the left and right from the center of one period of the PWM signal.

Figure 4:
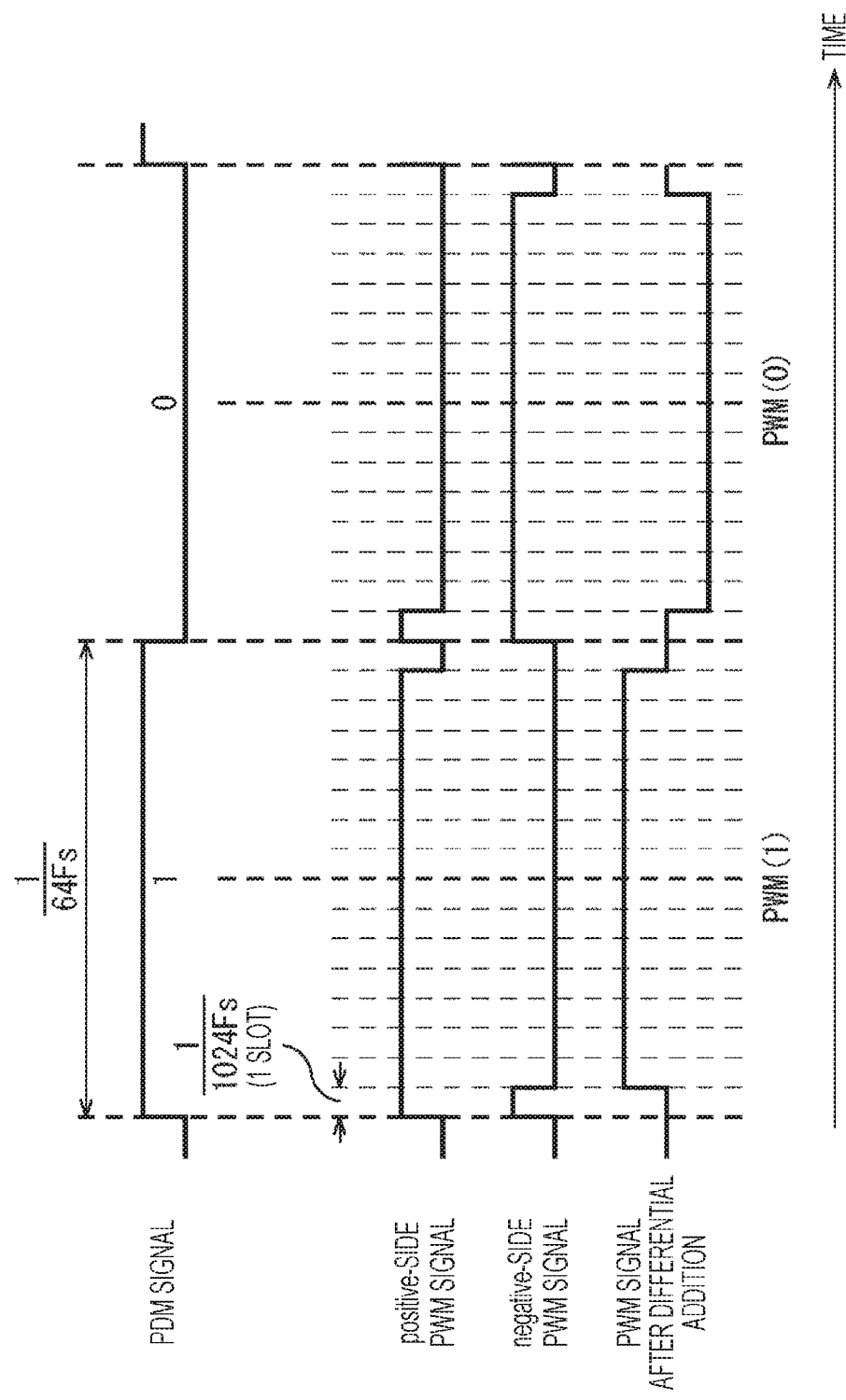
FIG. 4 is a waveform diagram illustrating PWM modulation in BTL drive.

FIG. 4 is a waveform diagram illustrating the PWM modulation in BTL drive.

FIG. 4 illustrates a PDM signal similar to that in FIG. 3.

Here, for BTL drive, a PWM signal includes a positive-side (or hot-side) PWM signal and a negative-side (or cold-side) PWM signal.

In the PWM modulation in BTL drive, a 1 of the PDM signal is converted into a positive-side PWM (1) that is a pulse of a maximum pulse width in one period of the PWM signal, and a negative-side PWM (1) that is a pulse of a minimum pulse width in one period of the PWM signal.

Moreover, in the PWM modulation in BTL drive, a 0 of the PDM signal is converted into a positive-side PWM (1) that is a pulse of the minimum pulse width in one period of the PWM signal, and a negative-side PWM (1) that is a pulse of the maximum pulse width in one period of the PWM signal.

Thus, in FIG. 4, the PWM modulation in BTL drive converts the 1 of the PDM signal into the positive-side PWM (1) that is a pulse of a pulse width of eight slots to the left (in the past direction) and seven slots to the right (in the future direction) from the center of one period of the PWM signal, and the negative-side PWM (1) that is a pulse of a pulse width of one slot at the position of the eighth slot to the left from the center of one period of the PWM signal (the start position of one period), for example.

Moreover, in FIG. 4, the PWM modulation in BTL drive converts the 0 of the PDM signal into the positive-side PWM (0) that is a pulse of a pulse width of one slot at the position of the eighth slot to the left from the center of one period of the PWM signal, and the negative-side PWM (0) that is a pulse of a pulse width of eight slots to the left and seven slots to the right from the center of one period of the PWM signal, for example.

BTL drive uses a PWM signal after differential addition to drive (the drive circuit 22 that provides an audio signal to) the speaker 13a and the speaker 13b. The PWM signal after differential addition is a signal of the positive-side PWM signal and the negative-side PWM signal differentially added. In the PWM signal after differential addition, the 1 of the PDM signal becomes a PWM (1) that is a pulse of a pulse width of seven slots to both the left and right from the center of one period of the PWM signal, and the 0 of the PDM signal becomes a PWM (0) that is a pulse of the PWM (1) inverted (phase-reversed).

Here, in the first PWM modulation in SE drive and the PWM modulation in BTL drive, the PDM signal is PWM-modulated into the PWM signal (PWM signal after differential addition) such that the position of the center of the pulses is located at the center of one period (of the carrier) of the PWM signal. That is, in the first PWM modulation in SE drive and the PWM modulation in BTL drive, the PDM signal is PWM-modulated into a pulse of a pulse width line-symmetric with respect to the center of one period.

In PWM modulation, if conversion into a PWM signal in which the position of the center of a pulse changes in each period of the PWM signal is performed, phase modulation is performed, and harmonic distortion and the like occur with the phase modulation. However, as in the first PWM modulation in SE drive and the PWM modulation in BTL drive, PWM modulation into a pulse of a pulse width line-symmetric with respect to the center of one period of the PWM signal can prevent phase modulation from being performed, and can prevent occurrence of harmonic distortion and the like.

Here, the rate of modulation of the PWM signal in FIGS. 3 and 4 will be described.

The rate of modulation of the PWM signal is proportional to the difference in pulse width between the PWM (1) and the PWM (0) of the PWM signal corresponding to the 1 and the 0 of the PDM signal, respectively, and can be determined by calculating the difference in duty ratio between the PWM (1) and the PWM (0).

For the PWM signal of the first PWM modulation in SE drive of FIG. 3, the PWM (1) is a pulse of a pulse width of fourteen slots in the PWM signal with a period of sixteen slots, and the PWM (0) is a pulse of a pulse width of two slots in the PWM signal with a period of sixteen slots. Thus, the rate of modulation of the PWM signal of the first PWM modulation in SE drive is 75% as in equation (1) below. Here, a rate of modulation of the PWM signal of 100% indicates that the PWM signal is at the level of the PDM signal before the PWM modulation.

$$\{(14/16)-(2/16)\}\times 100\%=75\% \quad (1)$$

For the PWM signal of the PWM modulation in BTL drive of FIG. 4, for example, for the positive-side PWM signal, the PWM (1) is a pulse of a pulse width of fifteen slots in the PWM signal with a period of sixteen slots, and the PWM (0) is a pulse of a pulse width of one slot in the PWM signal with a period of sixteen slots. Thus, the rate of modulation of the PWM signal of the PWM modulation in BTL drive is 87.5% as in equation (2) below.

$$\{(15/16)-(1/16)\}\times 100\%=87.5\% \quad (2)$$

When the pulse width of a pulse of a PWM signal is expressed in units of the largest possible number of slots, the unit of the largest possible number of slots is referred to as a minimum unit (pulse-width resolution). That is, the number of slots representing the period of the master clock of a maximum period required when a PWM signal is generated is referred to as a minimum unit.

In the first PWM modulation in SE drive, since the PDM signal is converted into a pulse that is line-symmetric with respect to the center of one period of the PWM signal, the minimum unit is two slots. On the other hand, in the PWM modulation in BTL drive, the minimum unit is one slot.

If the minimum unit is larger, the modulation rate is lower. Thus, for the first PWM modulation in SE drive and the PWM modulation in BTL drive, the modulation rate of the first PWM modulation in SE drive is lower than the modulation rate of the PWM modulation in BTL drive.

FIGS. 5A and 5B are waveform diagrams illustrating the second PWM modulation in SE drive.

In the second PWM modulation in SE drive, one of a 0 or 1 of a PDM signal is converted into a maximum-length pulse of a maximum pulse width of a PWM signal having a period equal to the period of the PDM signal, and the other of the 0 or 1 of the PDM signal is converted into a minimum-length pulse of a minimum pulse width of the PWM signal at a position adjacent to the center of the period of the PWM signal.

A PDM signal illustrated in FIGS. 5A and 5B are PDM signals obtained by PDM-modulating an audio signal at a sampling frequency of 64 Fs as in FIG. 3.

In FIG. 5A, a 1 of the PDM signal is converted into a maximum-length pulse that starts from the beginning of one period of a PWM signal, and a 0 of the PDM signal is converted into a minimum-length pulse with the end (falling edge) located at the center of one period of the PWM signal. Specifically, the 1 of the PDM signal is converted into a PWM (1) of a maximum-length pulse of a pulse width of eight slots to the left and seven slots to the right from the center of one period of the PWM signal, and the 0 of the PDM signal is converted into a PWM (0) of a minimum-length pulse of a pulse width of one slot at a position adjacent on the left to the center of one period of the PWM signal.

In FIG. 5B, a 1 of the PDM signal is converted into a maximum-length pulse that terminates at the end of one period of the PWM signal, and a 0 of the PDM signal is converted into a minimum-length pulse with the beginning (rising edge) located at the center of one period of the PWM signal. Specifically, the 1 of the PDM signal is converted into a PWM (1) of a maximum-length pulse of a pulse width of seven slots to the left and eight slots to the right from the center of one period of the PWM signal, and the 0 of the PDM signal is converted into a PWM (0) of a minimum-length pulse of a pulse width of one slot at a position adjacent on the right to the center of one period of the PWM signal.

In FIG. 5A, at first glance, it seems that the centers of the pulses of the PWM (1) and the PWM (0) do not coincide with the center of one period of the PWM signal, and the pulses of the PWM (1) and the PWM (0) are not line-symmetric with respect to the center of one period of the PWM signal. However, by changing the way of viewing (the interval of) one period of the PWM signal, as described in FIG. 6 described later, the centers of the respective pulses of the PWM (1) and the PWM (0) in A of FIG. 5A coincide with the center of one period of the PWM signal, and the respective pulses of the PWM (1) and the PWM (0) are line-symmetric with respect to the center of one period of the PWM signal.

The above point also applies to B of FIG. 5.

Figure 6:
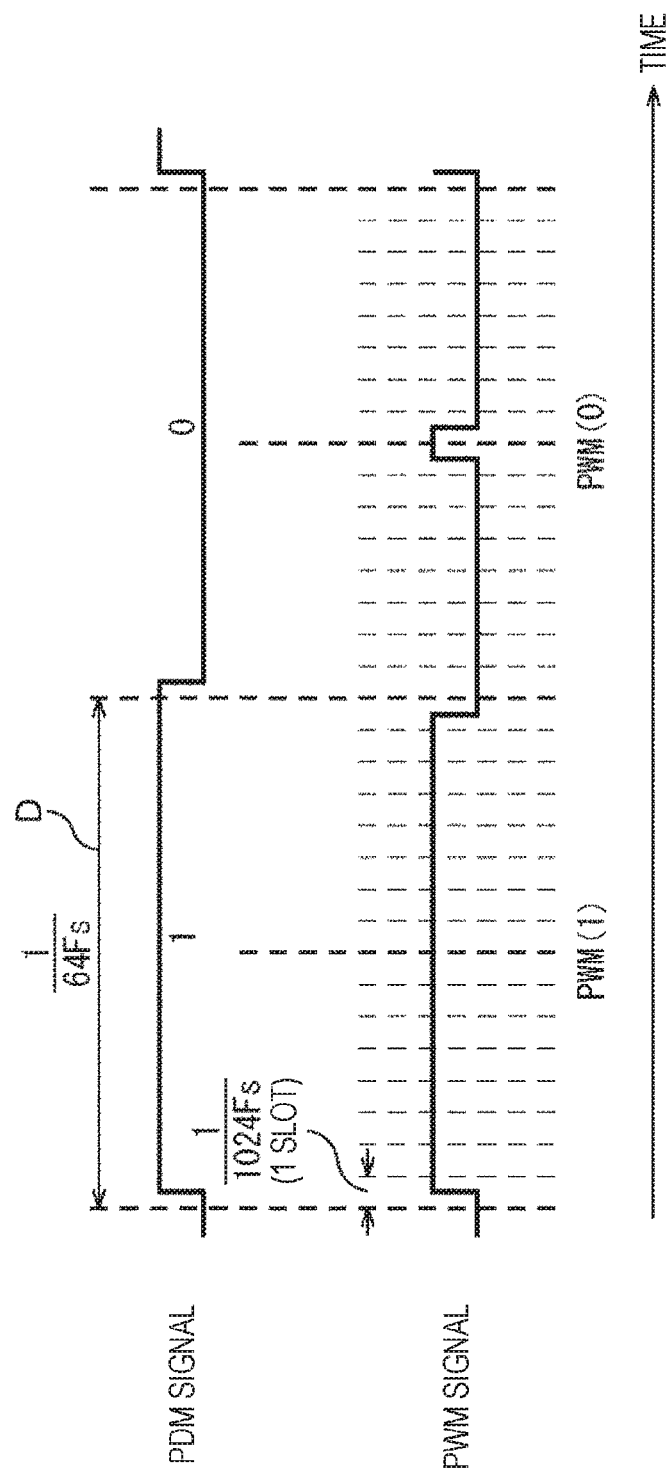
FIG. 6 is a waveform diagram illustrating another way of viewing the second PWM modulation in SE drive.

FIG. 6 is a waveform diagram illustrating another way of viewing the second PWM modulation in SE drive.

In FIG. 6, dotted lines delimiting the slots illustrated in FIGS. 5A and 5B are shifted by half a slot, and thus the slots are also shifted by half a slot. As illustrated in FIG. 6, by changing the way of viewing one period of the PWM signal such that one period of the PWM signal is an interval of sixteen slots indicated by D in the figure, the centers of the respective pulses of the PWM (1) and the PWM (0) come to coincide with the center of one period of the PWM signal, and the respective pulses of the PWM (1) and the PWM (0) become line-symmetric with respect to the center of one period of the PWM signal. Thus, the PWM signal of the second PWM modulation in SE drive is a PWM signal line-symmetric with respect to the center of one period, like the PWM signals of the first PWM modulation in SE drive and the PWM modulation in BTL drive.

As described above, even the second PWM modulation in SE drive, in which the position of the center of a pulse of a PWM signal is located at the center of one period of the PWM signal (has a line symmetry), can thus prevent occurrence of harmonic distortion and the like caused by phase modulation.

The modulation rate of (a PWM signal of) the second PWM modulation in SE drive can be determined by calculating the difference in duty ratio between the PWM (1) and the PWM (0), like those of the first PWM modulation in SE drive illustrated in FIG. 3 and the PWM modulation in BTL drive illustrated in FIG. 4.

For the PWM signal of the second PWM modulation in SE drive of FIGS. 5A, 5B, and 6, the PWM (1) is a pulse of a pulse width of fifteen slots in the PWM signal with a period of sixteen slots, and the PWM (0) is a pulse of a pulse width of one slot in the PWM signal with a period of sixteen slots. Thus, the rate of modulation of the PWM signal of the second PWM modulation in SE drive is 87.5% as in equation (3) below.

$$\{(15/16)-(1/16)\} \times 100\% = 87.5\% \quad (3)$$

According to equation (3), in the second PWM modulation in SE drive, the same modulation rate as that of the PWM modulation in BTL drive illustrated in FIG. 4 can be achieved.

Thus, the second PWM modulation in SE drive of FIGS. 5A and 5B can improve the modulation rate as compared with the first PWM modulation in SE drive in FIG. 3, and can improve the sound pressure of sound output from the speaker 13a and the speaker 13b in a case where SE drive is performed.

Here, in the second PWM modulation in SE drive, the 1 and 0 of the PDM signal are converted into the maximum and minimum pulse widths of the PWM signal, respectively, so that the modulation rate is higher than that of the first PWM modulation in SE drive in which the 1 and 0 of the PDM signal are not converted into the maximum and minimum pulse widths of the PWM signal.

Figure 7:
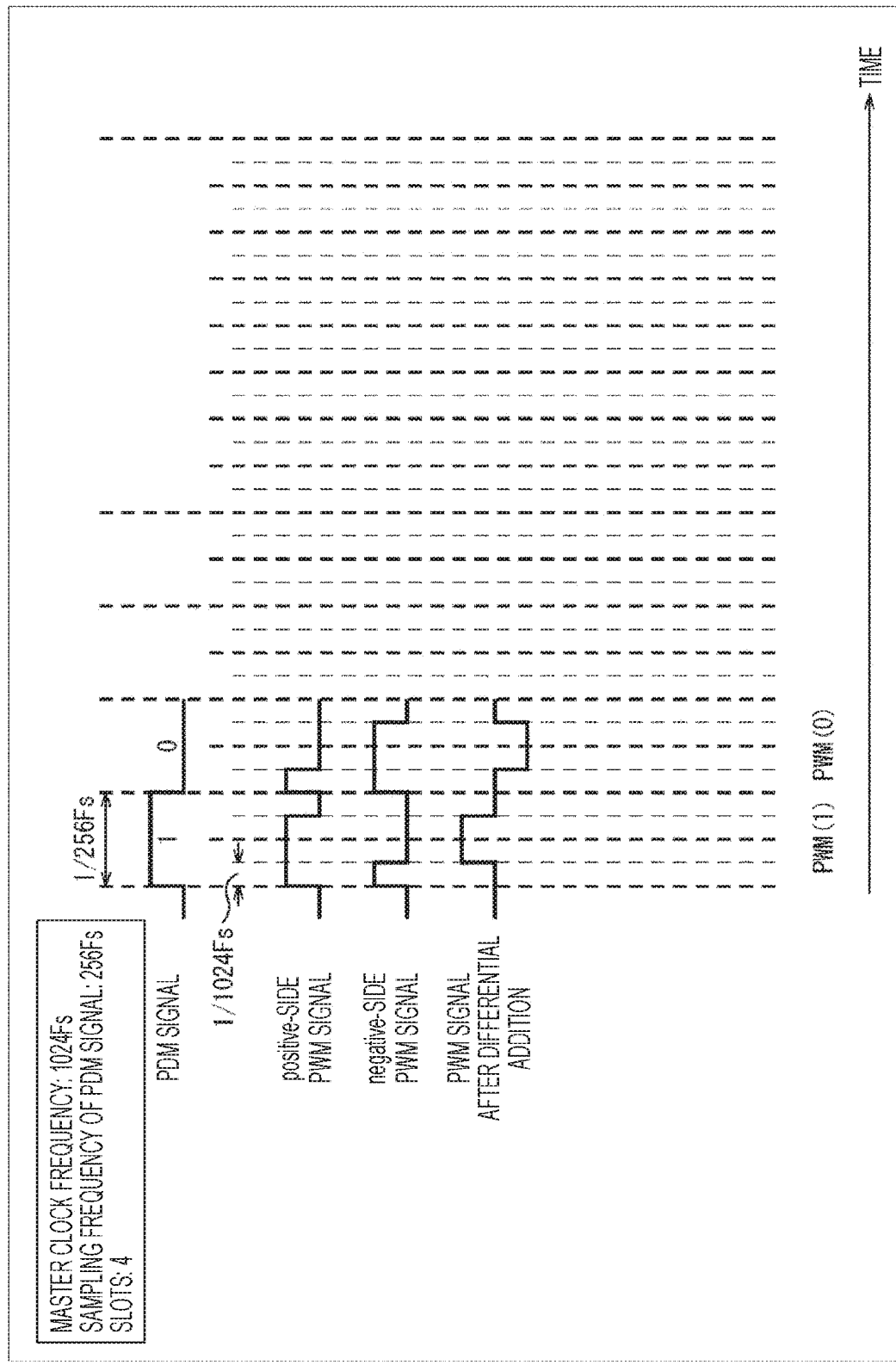
FIG. 7 is a waveform diagram illustrating the PWM modulation in BTL drive in a case where resolution is low.

FIG. 7 is a waveform diagram illustrating the PWM modulation in BTL drive in a case where resolution is low, that is, in a case where the number of slots in one period of a PWM signal is small.

FIG. 7 illustrates two samples (two periods) of a PDM signal in which a 0 and a 1 are continuous, obtained by PDM-modulating an audio signal at a sampling frequency of 256 Fs. Here, one period of the PDM signal is 1/(256 Fs).

Furthermore, in FIG. 7, as in FIG. 4, 1024 Fs is used as the frequency of the master clock required for generating a PWM signal by the PWM modulation. Here, one period of the master clock is 1/(1024 Fs).

Moreover, the resolution of the PWM signal, that is, the number of slots in one period of the PWM signal is sixteen slots in FIG. 4, whereas it is four (=1024 Fs/(256 Fs)) slots in FIG. 7.

As illustrated in FIG. 7, in the PWM modulation in BTL drive in a case where the resolution is four slots, the 1 of the PDM signal is converted into a positive-side PWM (1) that is a pulse of a pulse width of two slots to the left and one slot to the right from the center of one period of the PWM signal, and a negative-side PWM (1) that is a pulse of a pulse width of one slot at the position of the second slot to the left from the center of one period of the PWM signal.

Moreover, as illustrated in FIG. 7, in the PWM modulation in BTL drive in a case where the resolution is four slots, the 0 of the PDM signal is converted into a positive-side PWM (0) that is a pulse of a pulse width of one slot at the position of the second slot to the left from the center of one period of the PWM signal, and a negative-side PWM (0) that is a pulse of a pulse width of two slots to the left and one slot to the right from the center of one period of the PWM signal.

In a PWM signal after differential addition in which the positive-side PWM signal and the negative-side PWM signal as described above are differentially added, the 1 of the PDM signal becomes a PWM (1) that is a pulse of a pulse width of one slot to both the left and right from the center of one period of the PWM signal, and the 0 of the PDM signal becomes a PWM (0) that is a pulse of the PWM (1) inverted (phase-reversed).

Figure 8:
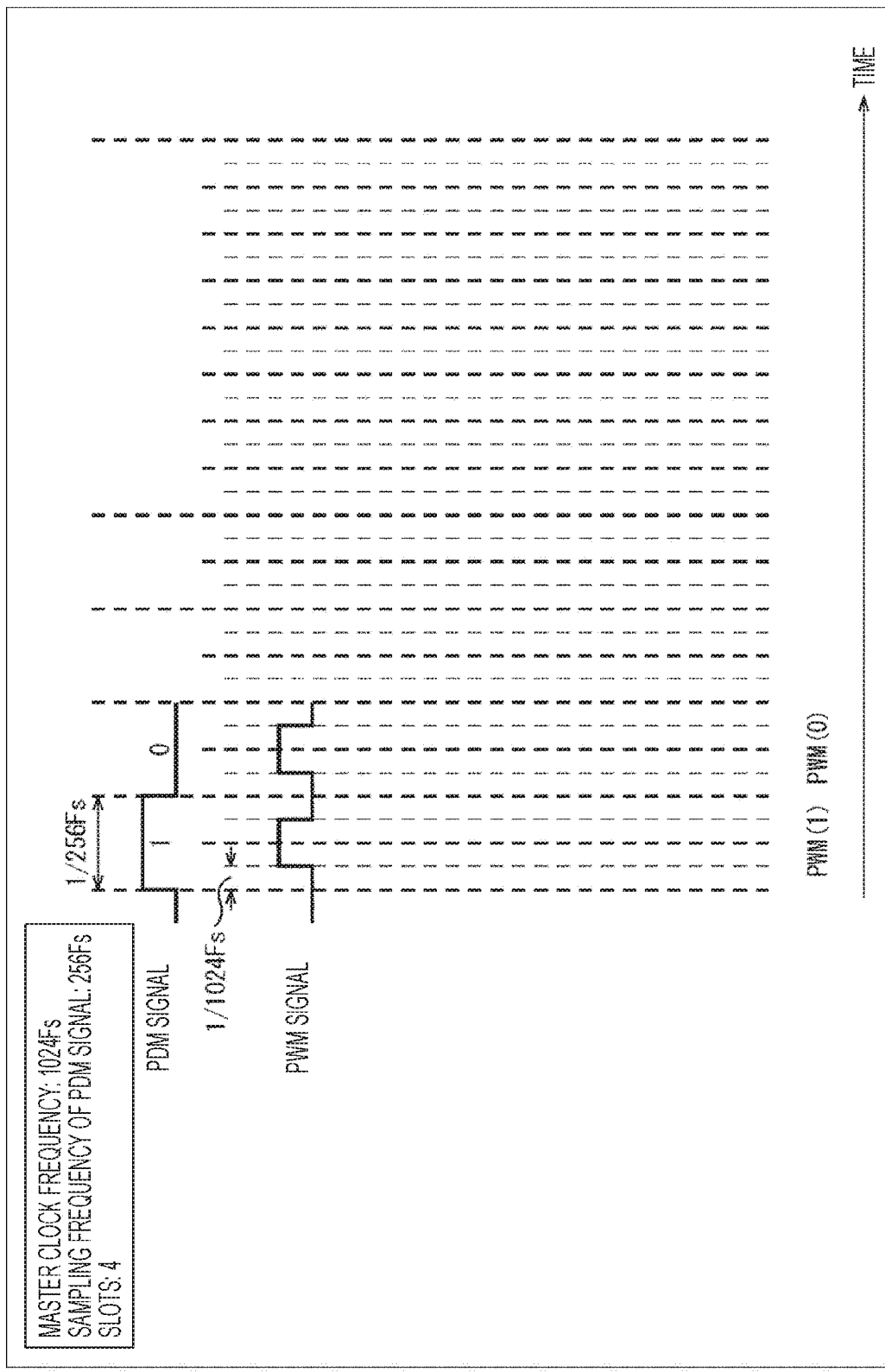
FIG. 8 is a waveform diagram illustrating the first PWM modulation in SE drive in a case where resolution is low.

FIG. 8 is a waveform diagram illustrating the first PWM modulation in SE drive in a case where resolution is low, that is, in a case where the number of slots in one period is small.

FIG. 8 illustrates a PDM signal similar to that in FIG. 7.

Furthermore, in FIG. 8, as in FIG. 3, 1024 Fs is used as the frequency of the master clock.

Moreover, the resolution of the PWM signal, that is, the number of slots in one period of the PWM signal is sixteen slots in FIG. 3, whereas it is four slots in FIG. 8.

As shown in FIG. 8, in the first PWM modulation in SE drive in a case where the resolution is four slots, a 1 of the PDM signal is converted into a PWM (1) that is a pulse of a pulse width of one slot to both the left and right from the center of one period of the PWM signal. Furthermore, in the first PWM modulation in SE drive, a 0 of the PDM signal is converted into a PWM (0) that is a pulse of a pulse width of one slot to both the left and right from the center of one period of the PWM signal. Thus, in a case where the resolution is low like four slots, in the first PWM modulation in SE drive, the PDM signal is converted into the PWM signal in which the PWM (1) and the PWM (0) are identical pulses.

As described above, in a case where the resolution of the PWM signal is low, the first PWM modulation in SE drive results in the PWM (1) and the PWM (0) being identical pulses, and cannot (substantially) perform the PWM modulation.

Figure 9:
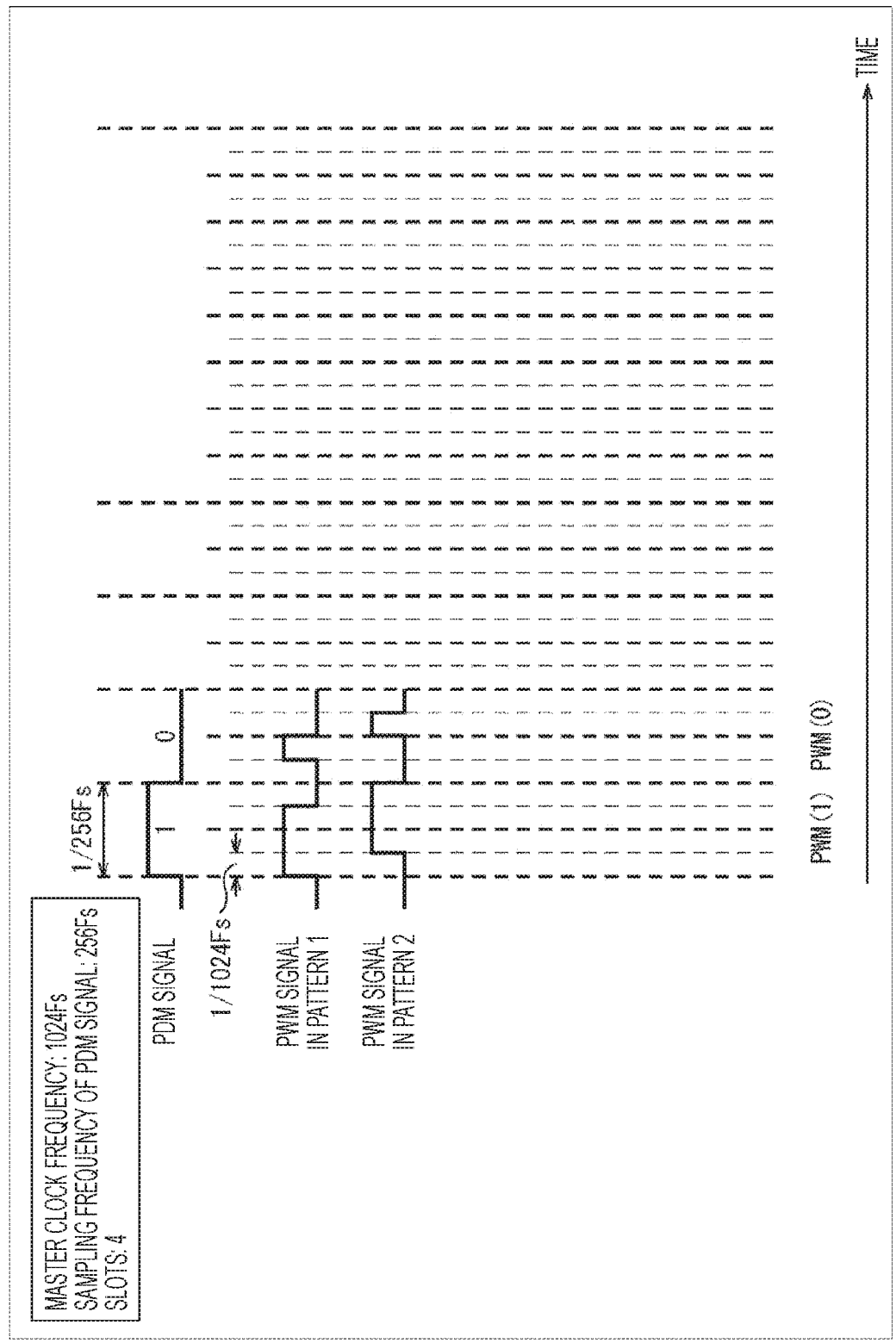
FIG. 9 is a waveform diagram illustrating the second PWM modulation in SE drive in a case where resolution is low.

FIG. 9 is a waveform diagram illustrating the second PWM modulation in SE drive in a case where resolution is low.

FIG. 9 illustrates a PDM signal similar to those in FIGS. 7 and 8.

Furthermore, in FIG. 9, as in FIG. 3, 1024 Fs is used as the frequency of the master clock.

Moreover, the resolution of the PWM signal, that is, the number of slots in one period of the PWM signal is sixteen slots in FIGS. 5A and 5B, whereas it is four slots in FIG. 9.

Here, the second PWM modulation in SE drive of FIG. 5A is referred to as PWM modulation in pattern 1, and a PWM signal obtained by the PWM modulation in pattern 1 is referred to as a PWM signal in pattern 1. Furthermore, the second PWM modulation in SE drive of FIG. 5B is referred to as PWM modulation in pattern 2, and a PWM signal obtained by the PWM modulation in pattern 2 is referred to as a PWM signal in pattern 2.

In a PWM signal in pattern 1 of FIG. 9, a 1 of the PDM signal is converted into a PWM (1) of a maximum-length pulse of a pulse width of two slots to the left and one slot to the right from the center of one period of the PWM signal, and a 0 of the PDM signal is converted into a PWM (0) of a minimum-length pulse of a pulse width of one slot at a position adjacent on the left to the center of one period of the PWM signal.

Furthermore, in a PWM signal in pattern 2 of FIG. 9, the 1 of the PDM signal is converted into a PWM (1) of a maximum-length pulse of a pulse width of one slot to the left and two slots to the right from the center of one period of the PWM signal, and the 0 of the PDM signal is converted into a PWM (0) of a minimum-length pulse of a pulse width of one slot at a position adjacent on the right to the center of one period of the PWM signal.

Thus, even in a case where the resolution of a PWM signal is at a low level at which PWM modulation is impossible by the first PWM modulation in SE drive, the second PWM modulation in SE drive can perform PWM modulation.

As described above, the second PWM modulation in SE drive can improve the rate of modulation of a PWM signal in SE drive as compared with the first PWM modulation in SE drive. Moreover, the improvement in the rate of modulation of a PWM signal allows an increase in the output level of the drive circuit 22 (the sound pressure output from the speaker 13a or the speaker 13b of the headphones 13) in SE drive.

Furthermore, for the first PWM modulation in SE drive and the PWM modulation in BTL drive, the modulation rate of the first PWM modulation in SE drive is lower than the modulation rate of the PWM modulation in BTL drive. Therefore, in a case where the first PWM modulation in SE drive is adopted in SE drive, it is difficult to design a level diagram to make the output level of the drive circuit 22 in SE drive equal to that in BTL drive.

On the other hand, in a case where the second PWM modulation in SE drive is adopted in SE drive, the second PWM modulation in SE drive and the PWM modulation in BTL drive can achieve the same modulation rate. Therefore, in a case where the second PWM modulation in SE drive is adopted, it is possible to reduce the difficulty of designing a level diagram to make the output level of the drive circuit 22 in SE drive equal to that in BTL drive.

Moreover, in a case where SE drive is used in a case where the resolution of a PWM signal (the number of slots in one period) is low due to the low frequency of the master clock, the high sampling frequency of a PDM signal, or the like, even if PWM modulation is difficult by the first PWM modulation in SE drive, the second PWM modulation in SE drive can perform PWM modulation.

Note that in FIGS. 5A and 5B, the 1 of the PDM signal is converted into the maximum-length pulse of the PWM signal, and the 0 of the PDM signal is converted into the minimum-length pulse of the PWM signal. Alternatively, the 0 of the PDM signal may be converted into the maximum-length pulse of the PWM signal, and the 1 of the PDM signal may be converted into the minimum-length pulse of the PWM signal <3. Description of Computer to which the Present Technology is Applied>

Next, a series of processing steps of the PWM converter 21 described above can be performed by hardware or can be performed by software. In a case where the series of processing steps is performed by software, a program constituting the software is installed on a computer.

Figure 10:
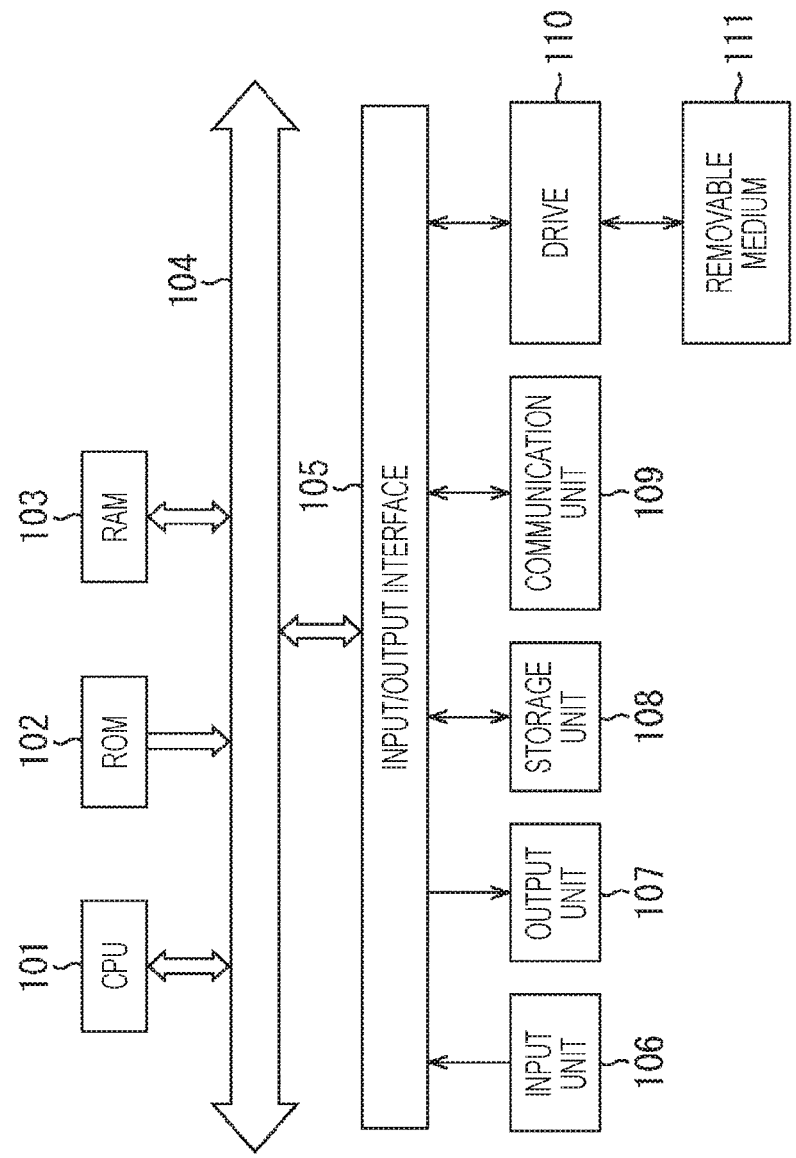
FIG. 10 is a block diagram illustrating a configuration example of an embodiment of a computer to which the present technology is applied.

Thus, FIG. 10 illustrates a configuration example of an embodiment of a computer on which a program to execute the above-described series of processing steps is installed.

In FIG. 10, a central processing unit (CPU) 101 executes various types of processing according to a program stored in read-only memory (ROM) 102 or a program loaded from a storage unit 108 into random-access memory (RAM) 103. In the RAM 103, data and others necessary for the CPU 101 to execute the various types of processing are also stored as appropriate.

The CPU 101, the ROM 102, and the RAM 103 are interconnected via a bus 104. An input/output interface 105 is also connected to the bus 104.

To the input/output interface 105, an input unit 106 including a keyboard and a mouse, or the like, a display including a liquid crystal display (LCD) or the like, an output unit 107 including speakers or the like, the storage unit 108 including a hard disk or the like, and a communication unit 109 including a modem, a terminal adapter, or the like are connected. The communication unit 109 performs communication processing via a network such as the Internet, for example.

To the input/output interface 105, a drive 110 is also connected as necessary, into which a removable medium 111 such as a magnetic disk, an optical disk, a magneto-optical disk, or a semiconductor memory is fitted as appropriate. A computer program read from them is installed in the storage unit 108 as needed.

Note that the program executed by the computer may be a program under which processing is performed in time series in the order described in the present description, or may be a program in which processing is performed in parallel or at a necessary timing such as when a call is made.

Embodiments of the present technology are not limited to the above-described embodiment, and various modifications can be made without departing from the scope of the present technology.

It should be noted that the effects described in the present description are merely examples and are not limiting, and effects other than those described in the present description may be included.

<Others>

The present technology can have the following configurations.

(1)

A signal processing apparatus including:

a pulse width modulation (PWM) converter that performs PWM modulation to convert one of a 0 or 1 represented by a bit of a pulse density modulation (PDM) signal into which an audio signal has been PDM-modulated, into a maximum-length pulse of a maximum pulse width of a PWM signal having a period equal to a period of the PDM signal, and convert the other of the 0 or 1 of the PDM signal into a minimum-length pulse of a minimum pulse width of the PWM signal at a position adjacent to a center of the period of the PWM signal.

(2)

The signal processing apparatus according to (1), in which the PWM converter converts the 1 of the PDM signal into the maximum-length pulse and converts the 0 of the PDM signal into the minimum-length pulse.

(3)

The signal processing apparatus according to (1) or (2), in which the PWM converter converts the 1 of the PDM signal into the maximum-length pulse starting from a beginning of the period of the PWM signal, and converts the 0 of the PDM signal into the minimum-length pulse with an end located at the center of the period of the PWM signal.

(4)

The signal processing apparatus according to (1) or (2), in which the PWM converter converts the 1 of the PDM signal into the maximum-length pulse terminating at an end of the period of the PWM signal, and converts the 0 of the PDM signal into the minimum-length pulse with a beginning located at the center of the period of the PWM signal.

(5)

The signal processing apparatus according to any one of (1) to (4), further including:

a drive circuit that amplifies the PWM signal; and a low-pass filter (LPF) that performs filtering on the PWM signal amplified by the drive circuit.

(6)

A signal processing method including:

performing pulse width modulation (PWM) to convert one of a 0 or 1 represented by a bit of a pulse density modulation (PDM) signal into which an audio signal has been PDM-modulated, into a maximum-length pulse of a maximum pulse width of a PWM signal having a period equal to a period of the PDM signal, and convert the other of the 0 or 1 of the PDM signal into a minimum-length pulse of a minimum pulse width of the PWM signal at a position adjacent to a center of the period of the PWM signal.

(7)

A program that causes a computer to execute processing to perform pulse width modulation (PWM) to convert one of a 0 or 1 represented by a bit of a pulse density modulation (PDM) signal into which an audio signal has been PDM-modulated, into a maximum-length pulse of a maximum pulse width of a PWM signal having a period equal to a period of the PDM signal, and convert the other of the 0 or 1 of the PDM signal into a minimum-length pulse of a minimum pulse width of the PWM signal at a position adjacent to a center of the period of the PWM signal.

REFERENCE SIGNS LIST

1 Audio reproduction system
11 Storage medium
12 Signal processing apparatus
13 Headphones
13a, 13b Speaker
21 PWM converter
22 Drive circuit
23 LPF
101 CPU
102 ROM
103 RAM
104 Bus
105 Input/output interface
106 Input unit
107 Output unit
108 Storage unit
109 Communication unit
110 Drive
111 Removable disk

The invention claimed is:

1. A signal processing apparatus, comprising:
a pulse width modulation (PWM) converter configured to perform PWM modulation to convert one of a 0 or 1 represented by a bit of a pulse density modulation (PDM) signal into which an audio signal has been PDM-modulated, into a maximum-length pulse of a maximum pulse width of a PWM signal having a period equal to a period of the PDM signal, and convert the other of the 0 or 1 of the PDM signal into a minimum-length pulse of a minimum pulse width of the PWM signal at a position adjacent to a center of the period of the PWM signal.

2. The signal processing apparatus according to claim 1, wherein the PWM converter is further configured to:
convert the 1 of the PDM signal into the maximum-length pulse; and
convert the 0 of the PDM signal into the minimum-length pulse.

3. The signal processing apparatus according to claim 2, wherein the PWM converter is further configured to:
convert the 1 of the PDM signal into the maximum-length pulse starting from a beginning of the period of the PWM signal; and
convert the 0 of the PDM signal into the minimum-length pulse with an end located at the center of the period of the PWM signal.

4. The signal processing apparatus according to claim 2, wherein the PWM converter is further configured to:
convert the 1 of the PDM signal into the maximum-length pulse terminating at an end of the period of the PWM signal; and
convert the 0 of the PDM signal into the minimum-length pulse with a beginning located at the center of the period of the PWM signal.

5. The signal processing apparatus according to claim 1, further comprising:
a drive circuit configured to amplify the PWM signal; and
a low-pass filter (LPF) configured to perform filtering on the PWM signal amplified by the drive circuit.

6. A signal processing method, comprising:
performing pulse width modulation (PWM) to
convert one of a 0 or 1 represented by a bit of a pulse density modulation (PDM) signal into which an audio signal has been PDM-modulated, into a maximum-length pulse of a maximum pulse width of a PWM signal having a period equal to a period of the PDM signal, and
convert the other of the 0 or 1 of the PDM signal into a minimum-length pulse of a minimum pulse width of the PWM signal at a position adjacent to a center of the period of the PWM signal.

7. A non-transitory computer-readable medium having stored thereon computer-executable instructions that, when executed by a signal processing apparatus, cause the signal processing apparatus to execute operations, the operations comprising:
performing pulse width modulation (PWM) to
convert one of a 0 or 1 represented by a bit of a pulse density modulation (PDM) signal into which an audio signal has been PDM-modulated, into a maximum-length pulse of a maximum pulse width of a PWM signal having a period equal to a period of the PDM signal, and convert the other of the 0 or 1 of the PDM signal into a minimum-length pulse of a minimum pulse width of the PWM signal at a position adjacent to a center of the period of the PWM signal.

\* \* \* \* \*